US009160312B2

(12) United States Patent
Lemkin

(10) Patent No.: US 9,160,312 B2
(45) Date of Patent: Oct. 13, 2015

(54) LOW LEAKAGE CIRCUITS, DEVICES, AND TECHNIQUES

(71) Applicant: DUST NETWORKS, INC., Hayward, CA (US)

(72) Inventor: Mark Alan Lemkin, Berkeley, CA (US)

(73) Assignee: DUST NETWORKS, INC., Hayward, CA (US)

( * ) Notice: Subject to any disclaimer, the term of this patent is extended or adjusted under 35 U.S.C. 154(b) by 207 days.

(21) Appl. No.: 13/763,190

(22) Filed: Feb. 8, 2013

(65) Prior Publication Data

US 2013/0257500 A1    Oct. 3, 2013

Related U.S. Application Data

(60) Provisional application No. 61/596,892, filed on Feb. 9, 2012.

(51) Int. Cl.
| | |
|---|---|
| G06F 1/00 | (2006.01) |
| H03K 3/011 | (2006.01) |
| G11C 11/417 | (2006.01) |
| G11C 5/14 | (2006.01) |

(52) U.S. Cl.
CPC .............. *H03K 3/011* (2013.01); *G11C 11/417* (2013.01); *G11C 5/14* (2013.01)

(58) Field of Classification Search
USPC .................................. 365/226, 237; 713/300
See application file for complete search history.

(56) References Cited

U.S. PATENT DOCUMENTS

| 7,023,761 | B1 * | 4/2006 | Tran ............................... 365/227 |
| 2008/0309384 | A1 * | 12/2008 | Guimont et al. .............. 327/143 |
| 2009/0200875 | A1 * | 8/2009 | Higuchi ........................ 307/125 |
| 2010/0231255 | A1 * | 9/2010 | Kim et al. ........................ 326/33 |
| 2011/0273951 | A1 * | 11/2011 | Li et al. .......................... 365/226 |
| 2012/0200336 | A1 * | 8/2012 | Ramaraju et al. ............. 327/512 |

OTHER PUBLICATIONS

Adam C. Cabe, et al.:"Stacking SRAM banks for ultra low power standby mode operation", Design Automation Conference (DAC), 2010 47th ACM/IEEE, IEEE, Piscataway, NJ, USA Jun. 13, 2010, pp. 699-704, XP031716008, ISBN: 978-1-4244-6677-1 *sections 1-4.2; figures 1, 5, 7*.

Extended European Search Report issued in European Application No. 13000683.6 dated Jun. 21, 2013.

Calhoun et al., "A 256-kb 65-nm Sub-threshold SRAM Design for Ultra-Lw-Voltage Operation" IEEE Journal of Solid State Circuits, vol. 42, No. 3, Mar. 2007, p. 680-688.

(Continued)

*Primary Examiner* — Vincent Tran
(74) *Attorney, Agent, or Firm* — McDermott Will & Emery LLP

(57) ABSTRACT

An integrated circuit includes circuitry organized into sub-blocks, and power supply selection circuitry operative to selectively adjust the connectivity of power supply terminals of the sub-blocks. When the integrated circuit is operating in an active mode, the power supply selection circuitry couples the sub-blocks in parallel between upper and lower active-mode power supplies; when the integrated circuit is operating in a standby mode, the power supply selection circuitry couples two or more sub-blocks in series between upper and lower standby-mode power supplies. Additionally, in standby mode, isolation circuitry within a sub-block is activated to isolate circuitry within the sub-block from input or output terminals of the sub-block.

27 Claims, 10 Drawing Sheets

(56) References Cited

OTHER PUBLICATIONS

Birla, et al. "Device and Circuit jDesign Challenges for Low Leakage SRAM for Ultra Low Power Application" Canadian Journal on Elec. & Electronics Engineering, vol. 1, No. 7, Dec. 2010, p. 156-167.
Sinangil, et al. "A Reconfigurable 8T Ultra-Dynamic Voltage Scalable (U-DVS) SRAM in 65 nm CMOS" IEEE Jour. of Solid State Circuits, vol. 44, No. 11, Nov. 2009, p. 3163-3173.
Moradi, et al. "65NM Sub-threshold 11T-SRAM for Ultra Low Voltage Applications" IEEE, Dec. 2008.
Sinagil, et al. "A Reconfigurable 65nm SRAM achieving Vltage Scalability from 0.25-1.2V and Performance Scalability from 20kHz-200Mhz" IEEE, 2008, MIT Libraries.
Wang, et at. "A 1.1 GHz 12 µA/Mb-Leakage SRAM Design in 65 nm Ultra-Low Power CMOS Technology with Integrated Leakage Reduction for Mobile Applications" IEEE, vol. 43, No. 1, Jan. 2008.
Calhoun, et al., Static noise Margin Variation for Sub-threshold SRAM in 65-nm CMOS, IEEE vol. 31, No. 7, Jul. 2006.
Cabe, et al. "Stacking SRAM Banks for Ultra Low Power Standby Mode Operation", DAC'10, Jun. 13-18, 2010, Anaheim, California p. 699-704.
Cabe, et al., "Experimental Demonstration of Standby Power Reduction using Voltage Stacking in an 8Kb Embedded FDSOI SRAM" GLSVLSI'11, May 2-4, 2011, Lausanne, Switzerland, p. 399-402.
Rajapandian, et al., "Implicit DC-DC Downconversion Through Charge-Recylcing" IEEE, vol. 40, No. 4, Apr. 2005, p. 846-852.
Inti, et al., "A Highly Digital 0.5-to-4Gb/s 1.9mW/Bg/s Serial Link Transeiver Using Current Recycling in 90 nm CMOS" 2011 IEEE Inter. Solid-State Circuits Conf. p. 152-154.
Craninckx, et al. "A 65fJ/Conversion-Step 0-to50MS/s 0-to-0.7mW 9b Charge-Sharing SAR ADC in 90nm Digital CMOS" IEEE Inter. Solid-State Circuits Conf (2007) p. 246-247.
Hesener, et al., "A 14 b 40MS/s Redundant SAR ADC with 480MHz Clock in 0.13 µm CMOS" 2007 IEEE Intl. Solid-State Circuits Conf. p. 248-249.
Giannini, et al. "An 820 µW 9b 40MS/s Noise-Tolerant Dynamic-SAR ADC in 90 nm Digital CMOS" 2008 IEEE Intl. Solid-State Circuits Conf. p. 238-239.

* cited by examiner

LOW LEAKAGE CIRCUITS, DEVICES, AND TECHNIQUES

CROSS-REFERENCE TO RELATED APPLICATION

This application claims priority to U.S. Provisional Patent Application No. 61/596,892 entitled "Low Leakage Circuits, Devices, and Techniques" and filed Feb. 9, 2012, which is incorporated herein by reference in its entirety for all purposes.

BACKGROUND

Integrated circuits having small feature sizes, such as CMOS process nodes 90 nm and below, have many advantages in terms of cost, speed, and dynamic power consumption. However, due to the small feature size of transistors and devices in such integrated circuits, the circuits have substantial leakage currents when in sleep-mode or standby-mode.

Today's deep submicron CMOS processes allow for smaller and lower-cost ICs, providing more functionality with lower active power consumption. However, a major disadvantage with these fine-line CMOS technologies is the large standby power consumption. The increased standby power arises from various sources. Some principal contributors include: VT scaling, drain-induced barrier lowering (DIBL), direct tunneling of carriers through the gate (gate leakage), and short/narrow channel effects. Device leakage is particularly high for the minimum-sized devices commonly used in SRAM cells. Furthermore, leakage increases super-linearly with temperature, and device leakage at the top end of industrial- or military-temperature ranges can be so high as to preclude the use of fine-line CMOS.

Mixed-signal and digital products (e.g. Dust Networks DN6000, Linear Technology LTC5800), often have an "active" or run mode and a "sleep" or standby mode. During active mode, the digital circuits and possibly analog circuits are enabled and perform one or more functions. The functions may be defined by hardware (e.g., a DMA transfer) or by software (e.g., service an interrupt). To conserve power, digital devices often go into a standby mode when a function is not actively being performed. One method of reducing power during standby mode is to completely remove power from a portion of the digital circuit. Using this method, a transistor in series with the digital logic or digital memory is turned off reducing the current leakage of the switch to almost zero. While the power savings is considerable, turning off the digital blocks results in loss of state. Specifically, the contents of a static memory, as well as the state of flip-flops, are lost. For a product such as a microcontroller, a microprocessor, a memory cache, a stand alone SRAM, or a digital circuit comprising a state machine, loss of state is unacceptable.

Lower standby power consumption would be very beneficial in products such as microcontrollers or wireless sensor nodes. In addition, battery-powered products that include deep-submicron digital circuitry, such as a feature phone or a smart phone, an e-reader such as the Amazon Kindle, a tablet computer such as an ipad, or a laptop computer all would benefit greatly from reduced sleep or standby power consumption. Lower standby power translates directly into longer battery life allowing the product manufacturer to substitute a smaller, lower cost battery to attain the same lifetime between charging or, for the same sized battery, increase lifetime between charging.

A need therefore exists for circuits having small feature sizes and having leakage currents reduced by an order of magnitude or more compared to conventional circuits.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

An integrated circuit can be configured to operate in either of an active mode and a standby mode (also referred to as active and standby states). In the active mode, the circuitry of the integrated circuit is connected to a power supply to enable the circuitry to perform various functions. In the standby mode, at least some of the circuitry of the integrated circuitry is powered down so as to reduce the total power consumed by the integrated circuitry in the standby mode. The circuitry can be powered down by lowering the amplitude of voltage supplied to the circuitry to a non-zero or zero value. The total power consumption is reduced by reducing the leakage currents flowing through the circuitry that is powered down. In general, the powering down of the circuitry includes disconnecting the circuitry from the power supply, or in some embodiments halting or gating a clock signal. In examples in which the circuitry includes state retention elements, such as registers or flip flops, the powering down of the circuitry to a zero volt supply can cause the state retention elements to lose their state.

Leakage currents generally refer to currents flowing through the gate terminals of NMOS and PMOS transistors and/or currents flowing from source or drain terminals of NMOS and PMOS transistors that are turned off (e.g., the leakage current can flow from a gate, source, or drain terminal into a body terminal of the transistor, and/or from a gate, source, or drain terminal into another one of the gate, source, or drain terminals). More generally, however, leakage currents may refer to currents flowing through a switch, through switching circuitry, or through other circuitry that is intended to be in a non-conducting state or otherwise turned off.

Figure 1A:
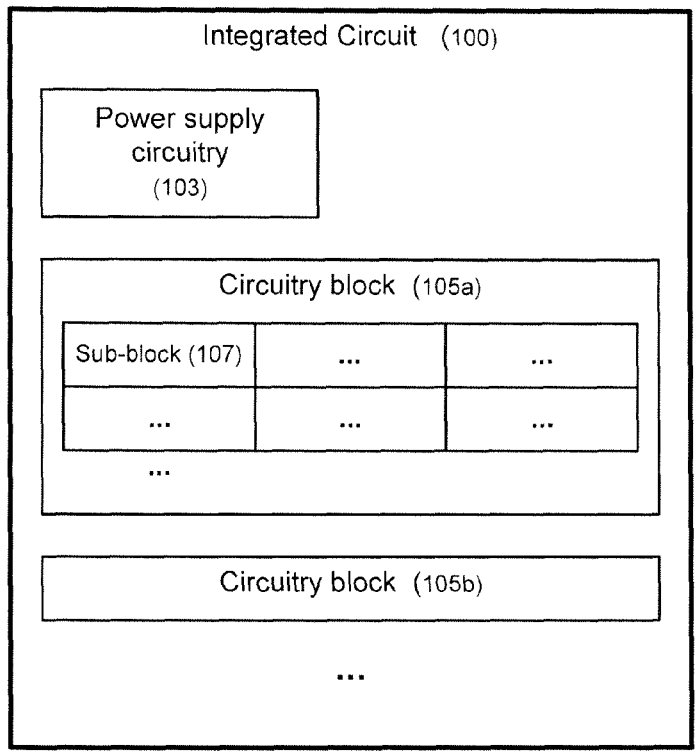
FIG. 1A shows an illustrative integrated circuit configured for providing low leakage currents when operating in standby mode.

FIG. 1A shows an illustrative integrated circuit 100 formed of various types of circuitry. The integrated circuit may form part of, or be formed on, a chip or microchip. In general, the integrated circuit 100 can be, include, or perform functions of any type of digital circuit, processor, microprocessor, controller, microcontroller, memory, or finite state machine, and can include logic circuitry as well as state retention circuitry such as register-transfer logic (RTL), registers, adders, flip-flops, or the like.

The integrated circuit 100 includes power supply circuitry 103, as well as various circuitry blocks 105a, 105b. The power supply circuitry 103 can include one or more of a pin or port for receiving an external power supply voltage or potential; an on-chip power supply; a battery; or the like. The power supply circuitry 103 can provide a single power supply voltage, between upper and lower power supplies, to the remaining circuitry of the integrated circuit 100. Alternatively, the power supply circuitry 103 can provide multiple power supply voltages to the remaining circuitry, each power supply voltage between respective upper and lower power supplies. The various power supply voltages can be provided to different parts of the circuitry (e.g., a first part of the circuitry operating with a 1.6V supply, and a second part of the circuitry operating with a 3.2V supply), and/or provided in different modes of operation of the circuitry (e.g., a 1.6V supply when the integrated circuit operates in the active mode, and a 3.2V supply when the integrated circuit operates in the standby mode).

Circuitry of the integrated circuit 100 can be divided into various blocks 105a, 105b. The blocks can be identified based on functional characteristics of the circuitry. In one example, circuitry block 105a includes circuitry having state retention elements, while circuitry block 105b includes circuitry not including state retention elements. During active mode, both circuitry blocks 105a and 105b receive power from the power supply circuitry 103. During standby mode, however, circuitry block 105b is disconnected from power (sometimes additionally having its upper and lower power supply terminals coupled together) in order to reduce power consumption of the integrated circuit 100; however, in order to preserve states stored by the circuitry of block 105a, circuitry block 105a continues to receive power from the power supply circuitry 103 during the standby mode.

In order to reduce the power consumed by circuitry of block 105a in standby, the circuitry of block 105a may be configured to operate from a reduced power supply amplitude during standby mode. For example, the circuitry of block 105a may be configured to operate from a 1.6V supply in active mode, and may be configured to operate (and preserve the state of the circuitry) from a supply amplitude as low as 200 mV in standby mode.

Figure 1B:
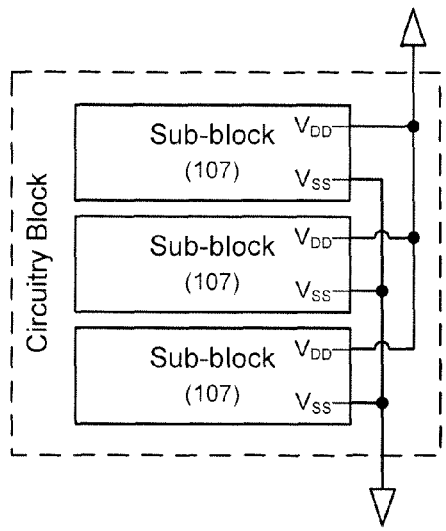
FIGS. 1B and 1C show two illustrative configurations of sub-blocks of integrated circuitry for use in active and standby modes, respectively.

The circuitry of block 105a is shown in FIG. 1A as being divided into a plurality of sub-blocks 107. Each sub-block includes a portion of the circuitry, and the plurality of sub-blocks jointly include all of the circuitry of block 105a. As shown in FIG. 1B, when operating in active mode, each sub-block 107 of circuitry blocks 105a and 105b has an upper power-supply terminal $V_{DD}$ coupled to an upper power supply and a lower power-supply terminal $V_{SS}$ coupled to the lower power supply. All of the sub-blocks can be coupled between the same upper and lower power supplies, as shown in FIG. 1B. Alternatively, different sub-blocks can be coupled to different power supplies (e.g., sub-blocks of circuitry 105a may be coupled to a first power supply having a voltage of 1.6V, while sub-blocks of circuitry 105b may be coupled to a second power supply having a voltage of 1.2V).

Figure 1C:
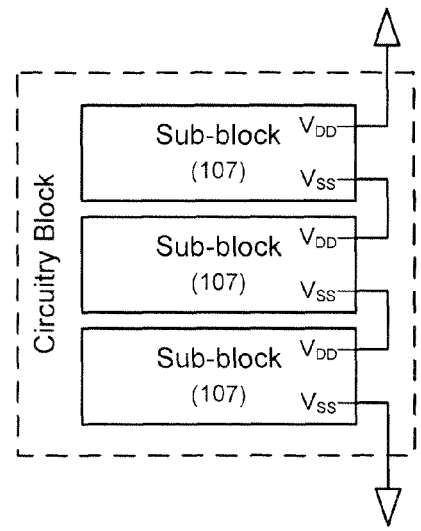

When operating in standby mode, two or more sub-blocks 107 of block 105a are coupled in series between the upper and lower power supplies, as shown in FIG. 1C. In particular, in the example of FIG. 1C, three sub-blocks 107 are shown as being coupled in series between the upper and lower power supplies. A first sub-block has a lower power-supply terminal $V_{SS}$ coupled to the lower power supply, and an upper power-supply terminal $V_{DD}$ coupled to a lower power-supply terminal of a next sub-block in the series (i.e., of the middle sub-block in the illustrated example showing three sub-blocks). A last sub-block in the series has a lower power-supply terminal $V_{SS}$ coupled to an upper power-supply terminal $V_{DD}$ of a previous sub-block in the series (i.e., of the middle sub-block in the illustrated example), and an upper power-supply terminal $V_{DD}$ coupled to the upper power supply.

The upper and lower power supplies used by all of the various sub-blocks 107 during the standby mode can be the same power supplies, or different power supplies (e.g., sub-blocks of circuitry 105a can be coupled in series between first power supplies, while sub-blocks of another portion of circuitry can be coupled in series between different second power supplies). Also, the power supplies used during the standby mode can be the same power supplies used during the active mode; alternatively, different standby-mode and active-mode power supplies can be used. In one example, an active-mode power supply of 1.6V (e.g., as regulated by a low-dropout regulator) is used to power the circuitry during active mode, while a standby-mode power supply of 3.2V (e.g., a battery) is used to power the circuitry during standby mode. In other examples, the standby mode power supply provides a voltage that is higher than the integrated circuit's normal operating voltage (and/or higher than the chip's normal operating voltage or core voltage); however, even in such an example, the voltage supplied to any individual sub-block in the series coupling remains no higher than the integrated circuit's normal operating voltage during standby mode.

Figure 2A:
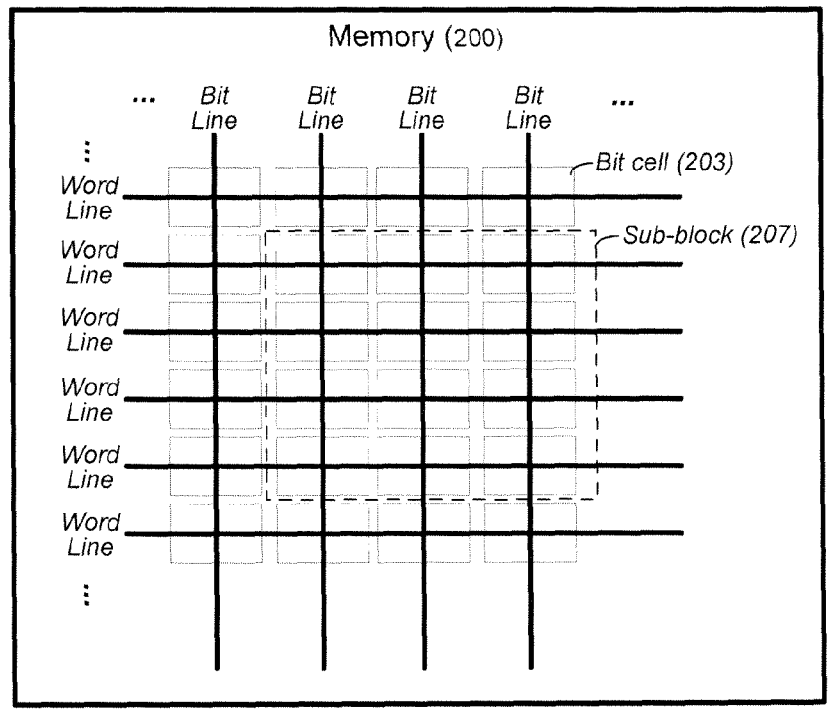
FIG. 2A shows an illustrative memory configured for providing low leakage currents when operating in standby mode.
Figure 2D:
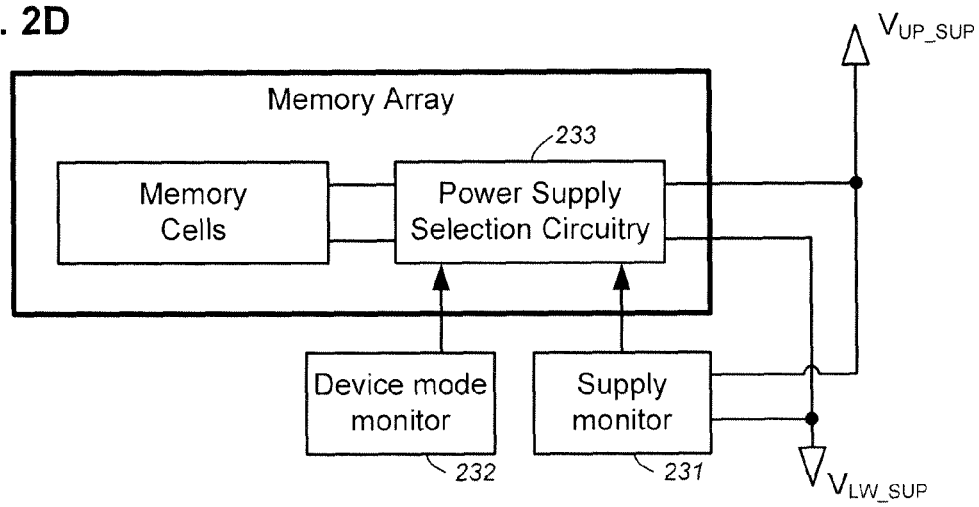
FIG. 2D shows illustrative circuitry used for power supply selection in an integrated circuit.
Figure 2B:
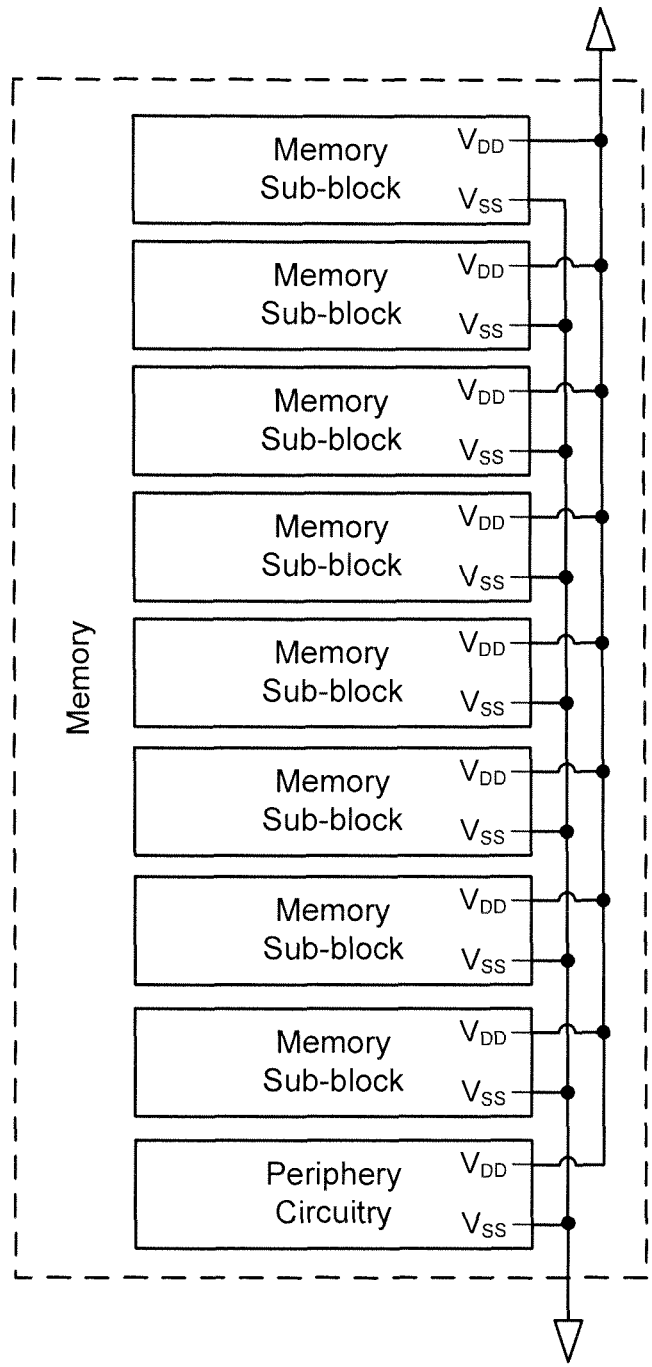
FIGS. 2B and 2C show illustrative configurations of memory sub-blocks for use in active and standby modes.
Figure 2C:
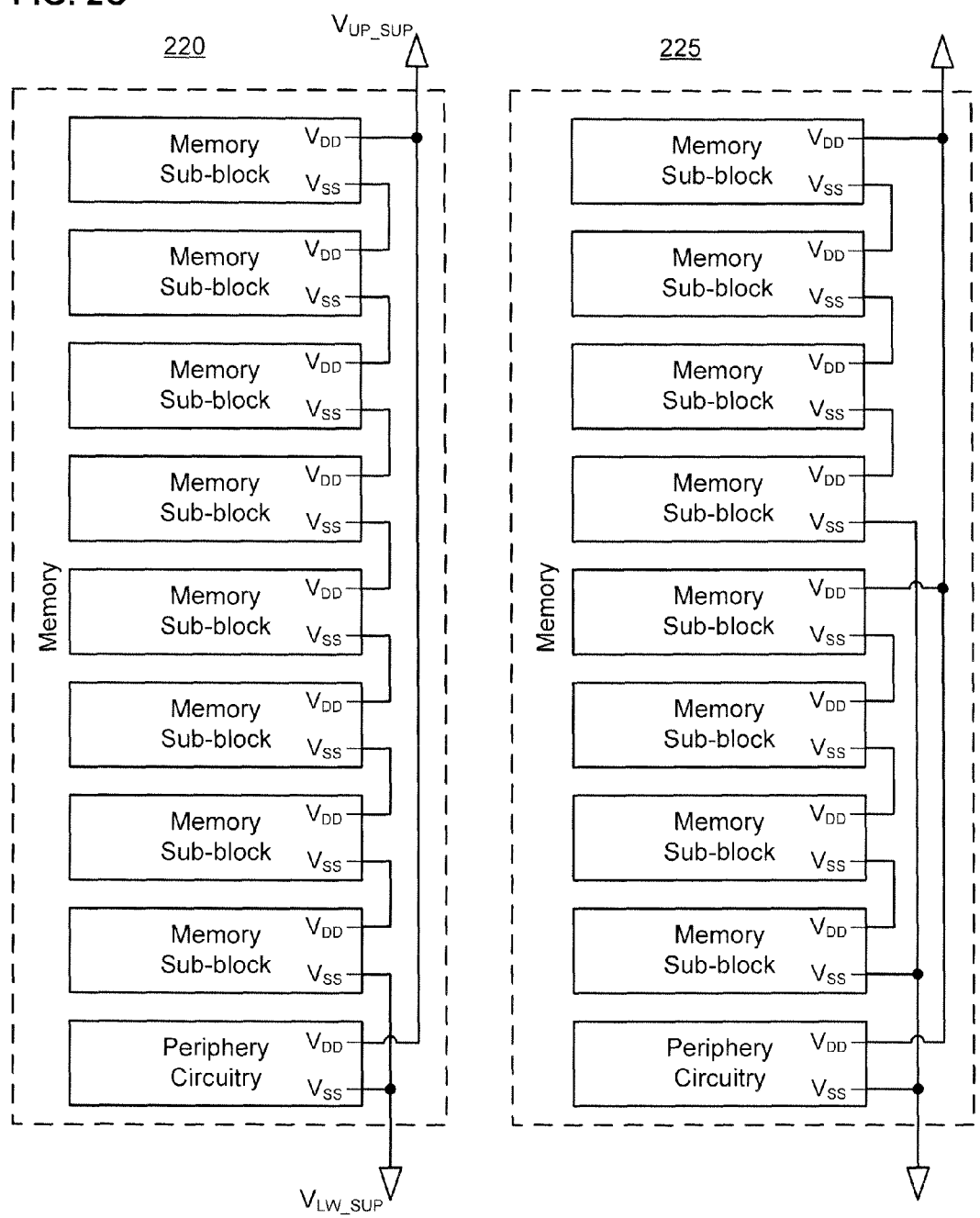

In one example, the integrated circuit 100 comprises a memory. Various features of the integrated circuit 100 of FIG. 1A are described in relation to the memory example in relation to FIGS. 2A-2D. A memory 200, such as an SRAM cell shown in FIG. 2A, includes multiple rows and columns of bit cells 203. To save power the entire memory may be broken up into a plurality of sub-blocks 207 or sections. Each sub-block 207 has a separate upper power supply terminal (e.g., $V_{DD}$) and a separate lower power supply terminal (e.g., $V_{SS}$) to supply power to the bit cells within the sub-block, as shown in FIG. 2B. The sub-blocks 207 are equal-sized and each include a large number of bit cells 203 spanning multiple rows and/or columns. In a first example, the memory 200 is operative to reconfigure the sub-blocks 207 differently dependent on whether the memory is operating in active mode (e.g., run mode) or in standby mode (also referenced as an active state and a standby state). During active mode, the sub-blocks 207 are connected in parallel between the upper and lower power supply terminals, as shown in FIG. 2B, such that the sub-blocks' $V_{DD}$ terminals are connected together to an upper power supply for the circuitry (e.g., an upper 1.2V regulated supply used to supply power to the digital core of an integrated circuit chip) and the sub-blocks' $V_{SS}$ terminals are connected to a lower power supply for the circuitry (e.g., ground). However, during standby mode, the sub-blocks are re-connected in series between the upper and lower power supplies for the circuitry, as shown in FIG. 2C. As such, in standby mode, a first sub-block's $V_{DD}$ terminal is connected directly to the upper power supply for the circuitry, a second sub-block's $V_{DD}$ terminal is connected to the first sub-block's $V_{SS}$ terminal, a third sub-block's $V_{DD}$ terminal is connected to the second sub-block's terminal, and a final sub-block in the series re-connection has its $V_{DD}$ terminal connected to a previous sub-block's $V_{SS}$ terminal and its $V_{SS}$ terminal connected to the lower power supply for the circuitry, as shown in FIG. 2C.

In general, during standby mode, the sub-blocks are connected in series between the upper and lower power supplies used to power the circuitry during the active mode. In some examples, however, the sub-blocks are connected in series to a power supply other than the power supply used during active mode, such as between a regulated voltage set by a regulator and ground or the lower power supply.

During standby mode, when the sub-blocks are connected in series, the current into a sub-block flows through the sub-block and into the sub-block beneath it in the series interconnection. In this manner, the energy from the supply is used to maintain state in the lower sub-block(s) in the series interconnection as well as the upper sub-block. In contrast, in conventional circuitry in which each sub-block is connected between the upper and lower power supplies, the energy from the supply is squandered as heat after passing through a single sub-block.

The number of sub-blocks connected in series between the upper and power supplies in the standby mode is a design choice, and may be determined in conjunction with factors such as the minimum voltage needed by each sub-block to ensure state retention within the sub-block, and the operating voltage range of the device. For example, if a memory (or memory sub-blocks within the memory) needs 200 mV to reliably maintain state, and the operating range of the memory is 2.1V to 3.75V, then up to 10 sub-blocks may be stacked in series with the top sub-block connected directly to the upper power supply. When the supply is at the minimum allowed voltage (2.1V), each sub-block has 210 mV across it and the power consumption is reduced by a factor of 10 as compared to a conventional memory. If the supply rises to 3.75V, then each of the 10 sub-blocks has 375 mV across which enables the sub-blocks to operate reliably. However, because each sub-block operates with 375 mV rather than the 200 mV minimum for standby across its terminals, power is wasted. In particular, power is wasted because the leakage through the sub-blocks is increased at 375 mV as compared to 210 mV, and because more sub-blocks could be added in the series connected between the upper and lower power supplies (e.g., 18 sub-blocks could be connected in series, each having 208 mV across its terminals) to further reduce the current through the sub-blocks in standby mode.

In the first example 220 shown in FIG. 2C, eight sub-blocks are connected in series between an upper power supply $V_{UP\_SUP}$ and a lower power supply $V_{LW\_SUP}$, while a portion of the circuitry (identified in the figure as "periphery circuitry", and including such circuitry as amplifiers and decoders) receives a full power supply voltage between its terminals connected to the upper power supply $V_{UP\_SUP}$ and the lower power supply $V_{LW\_SUP}$ during standby mode. Alternatively, in some embodiments, a portion of the circuitry (e.g., the periphery circuitry, or circuitry not including state retention elements) has both its terminals connected to the lower power supply $V_{LW\_SUP}$ during standby mode in order to power down the circuitry during standby mode; one terminal is disconnected from a power supply terminal while the other is connected to a power supply terminal; both terminals are disconnected from their respective power supply terminals; or any other appropriate configuration to partially- or fully-disconnect power from the portion of the circuitry. In other embodiments, the periphery circuitry can be coupled to a power supply different from the upper power supply $V_{UP\_SUP}$ during the standby mode, for example in situations in which the voltage between the upper and lower power supplies $V_{UP\_SUP}$ and $V_{LW\_SUP}$ during standby mode exceeds a maximum supply voltage of the periphery circuitry.

In a second example 225 shown in FIG. 2C, the sub-blocks are connected in sets of four sub-blocks (or any other appropriate number of sub-blocks) during standby mode. The sub-blocks in each set are connected in series between the upper and lower power supplies $V_{UP\_SUP}$ and $V_{LW\_SUP}$, while each set of sub-blocks is connected in parallel with the other sets between the upper and lower power supplies.

In some embodiments, a power supply monitor circuit 231 dynamically monitors the supply voltage ($V_{UP\_SUP}$ and $V_{LW\_SUP}$) during standby, and adjusts the configuration of the sub-blocks to maintain an optimal configuration. For example, FIG. 2D illustratively shows a memory array including two or more memory cells or sub-blocks. Power supply selection circuitry 233 is connected to upper and lower power supplies, and selectively connects the bit cells in parallel or series between the power supplies. The power supply selection circuitry 233 adjusts the connectivity of the bit cells based on a signal received from a device mode monitor 232 and indicative of the operating mode (standby mode or active mode) of the memory circuit and/or of the integrated circuit it forms part of. Additionally, the power supply selection circuitry 233 adjusts the connectivity of the bit cells based on a signal received from a power supply monitor circuit 231 and indicative of the voltage difference between the upper and lower power supplies.

In an example, the power supply selection circuitry 233 determines, when the memory circuit is determined to be operating in (or being switched to operate in) standby mode, the voltage difference between the upper and lower power supplies. The power supply selection circuitry then determines an optimal configuration for connecting the memory sub-blocks between the upper and lower power supplies in order to reduce leakage current. In the example, the power supply selection circuitry 233 may determine a maximum number of memory sub-blocks that can be coupled in series between the upper and lower power supplies while ensuring that each sub-block receives its minimum standby voltage. The power supply selection circuitry 233 then adjusts the connectivity of the bit cells and/or sub-blocks as determined. The power supply monitor 231 and selection circuitry 233 can operate continuously while the memory is operating in the standby mode to dynamically adjust the connectivity of the bit cells and/or sub-blocks in response to variations in the voltage supply amplitude.

In some embodiments, the supply monitor 231 includes a gate-leakage based supervisor similar to that described in U.S. patent application Ser. No. 13/666,916 (filed Nov. 1, 2012) to monitor the supply and adjust the configuration of sub-blocks in response to a change in supply voltage. In one example, a SRAM is broken up into sixteen sub-blocks, and the SRAM is configured with the sixteen sub-blocks in series when the supply is greater than 3.2V (such that each sub-block is supplied with a minimum 200 mV voltage during standby). If the supply drops below the 3.2V threshold value, the SRAM is reconfigured such that a series stack of eight pairs of parallel-connected sub-blocks is used.

In some embodiments, the power supply selection circuitry provides a finer control of the connectivity between sub-blocks, such that groups of sub-blocks can be placed in parallel and these parallel groups of sub-blocks can be placed in series thereby enabling improved device performance and optimal tracking of the supply voltage. In some embodiments, the sub-blocks are re-configured in sizes that are not equal before being placed in series.

While FIG. 2D shows an illustrative memory array in which a single power supply selection circuitry 233, device mode monitor 232, and supply monitor 231 are used to dynamically monitor the power supply and adjust the connectivity of bit cells or sub-blocks, multiple supply monitors may be used (e.g., in situations in which an integrated circuit has multiple different power supplies used in standby mode), multiple device mode monitors may be used (e.g., in integrated circuits in which different portions of circuitry may independently be put into standby or active mode, and in which a separate device monitor is used for each portion of circuitry), and/or multiple power supply selection circuitry may be used.

The power supply selection circuitry, in addition to adjusting the connectivity of upper and lower power supply terminals of sub-blocks, can be configured to adjust the connectivity of body or well terminals of NMOS and PMOS devices within each sub-block. NMOS devices may be fabricated within one or more p-wells within the integrated circuit substrate, and body terminals connected to one or more p-wells within a sub-block can be coupled together and to an n-body terminal $V_{NBODY}$. A p-well may be electrically isolated from the surrounding p-substrate by forming the p-well within a deep n-well in fine-line CMOS technologies providing for deep n-well among their process options. Similarly, PMOS devices may be fabricated within n-wells within the integrated circuit substrate, and body terminals connected to the n-wells within a sub-block can be coupled together and to a p-body terminal $V_{PBODY}$.

During active mode, the $V_{NBODY}$ terminal of a sub-block is generally coupled to the substrate voltage (e.g., ground, or the lower power-supply terminal of the sub-block) while the $V_{PBODY}$ terminal is coupled to the upper power supply voltage (e.g., $V_{UP\_SUP}$, or the upper power-supply terminal of the sub-block). When the power supply selection circuitry adjusts the connectivity of the upper and lower power supply terminals of the sub-blocks, the power supply selection circuitry may additionally adjust the connectivity of the $V_{NBODY}$ and $V_{PBODY}$ terminals of each sub-block.

Figure 3A:
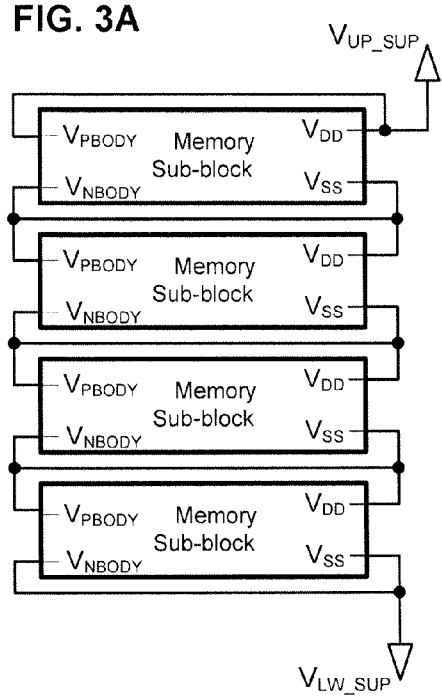
FIGS. 3A-3F show illustrative configurations of memory sub-blocks, and of connections for n-body and p-body terminals of sub-blocks, for use in standby mode.

In one embodiment, the NMOS and PMOS body terminals within a sub-block are tied to the sub-block's $V_{SS}$ and $V_{DD}$ terminals during standby mode, as illustratively shown in FIG. 3A. This embodiment has the advantage that each sub-block has the same backgate voltage with respect to the sources. Thus, the voltage dropped across each sub-block will be approximately equal if the sub-blocks are of similar size.

Figure 3B:
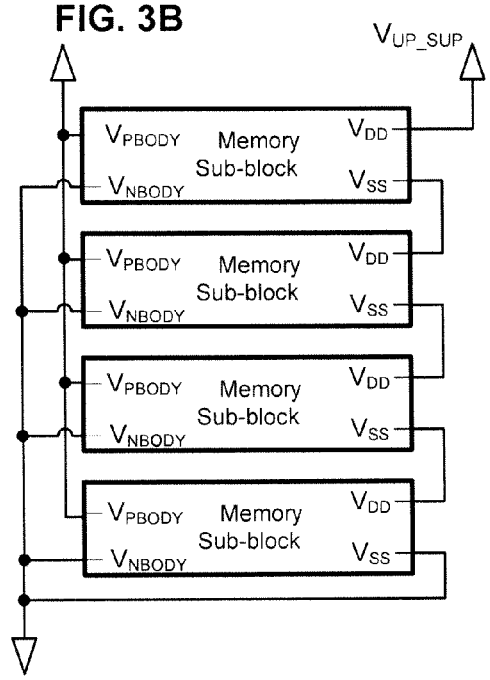

In another embodiment, the NMOS body voltages within a sub-block are tied to a potential (e.g., chip ground) common to all sub-blocks, and the PMOS body voltages within a sub-block are tied to a potential (e.g., chip $V_{UP\_SUP}$) common to all sub-blocks during standby mode, as illustratively shown in FIG. 3B. This embodiment has the advantage that an isolation structure, such as a p-well isolated by a deep n-well, is not required to isolate the NMOS bodies from the substrate.

Figure 3C:
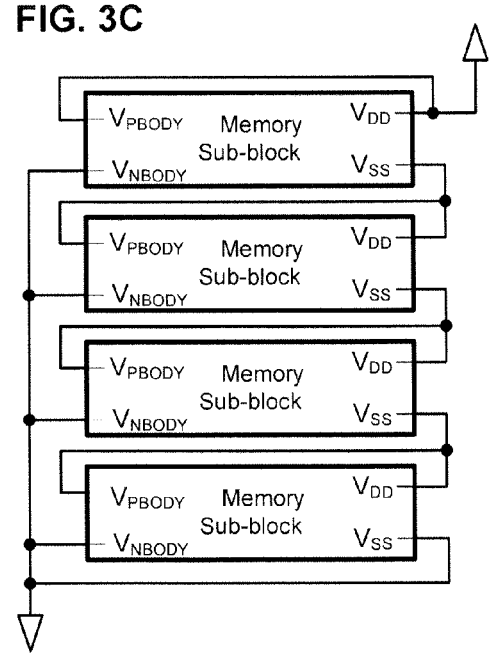

In another embodiment, during standby mode, the NMOS body voltages within a sub-block are tied to a potential (e.g., chip ground) common to all sub-blocks and the PMOS body voltages within a sub-block are tied to the $V_{DD}$ terminal of the sub-block, as illustratively shown in FIG. 3C. This embodiment has the advantage that an isolation structure is not required to isolate the NMOS bodies from the substrate.

Figure 3D:
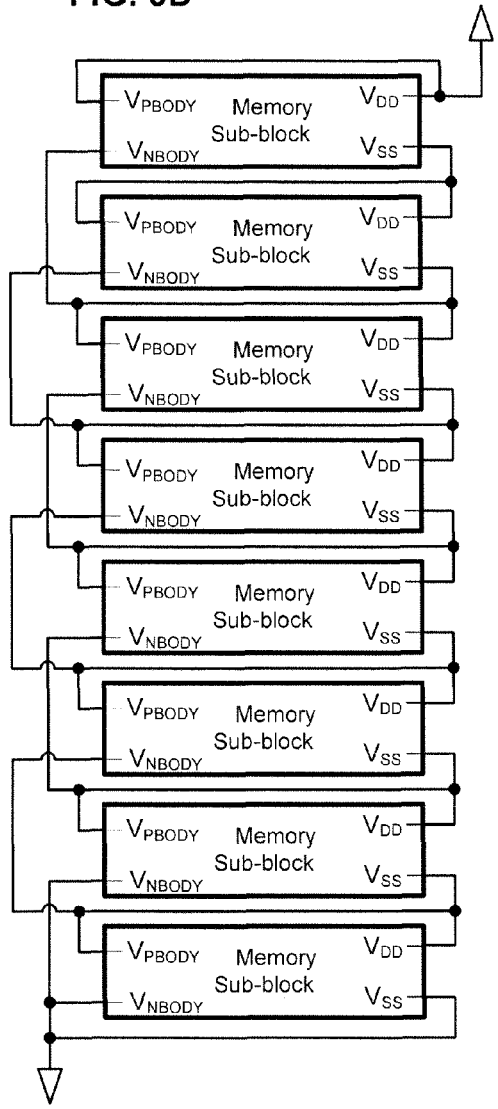
Figure 3E:
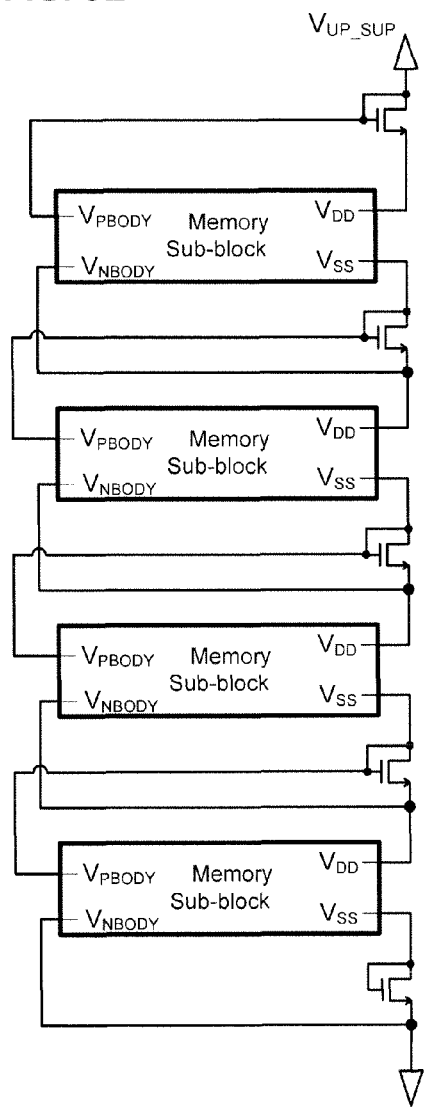

In one embodiment, during standby mode, the NMOS body voltages within a sub-block are tied to a tap lower in the series-connected string of sub-blocks thereby providing a lower potential than the NMOS sources in the sub-block and reducing leakage via the body-effect. In a first example shown in FIG. 3D, one sub-block's $V_{NBODY}$ terminal is coupled to the $V_{SS}$ terminal of a next/lower sub-block in the series-connected string of sub-blocks, and/or coupled to the $V_{DD}$ terminal of second lower sub-block in the series-connected string. In a second example shown in FIG. 3E, a diode-connected transistor having the gate and drain terminals coupled to one sub-block's $V_{SS}$ terminal is used to generate a potential at the transistor's source terminal that is lower than the voltage at the $V_{SS}$ terminal and is used to bias the $V_{NBODY}$ terminal of the sub-block. In the examples of FIGS. 3D and 3E, the bottom-most sub-block in the series-connected string has NMOS body terminals connected to ground, yielding a zero $V_{BS}$ voltage.

Figure 3F:
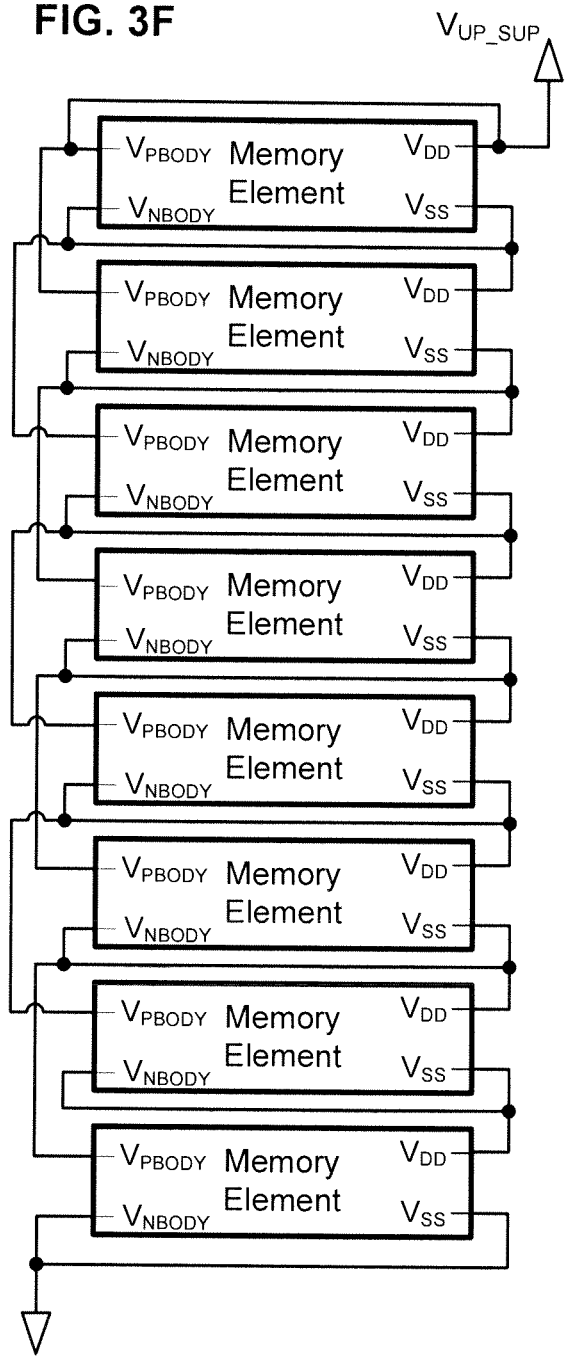

In the same or other embodiment(s), during standby mode, the PMOS body voltages within a sub-block are tied to a tap higher in the series-connected string of sub-blocks thereby providing a higher potential than the PMOS sources in the sub-block and reducing leakage via the body-effect. In a first example shown in FIG. 3F, one sub-block's $V_{PBODY}$ terminal is coupled to the $V_{DD}$ terminal of a previous/higher sub-block in the series-connected string of sub-blocks, and/or coupled to the $V_{SS}$ terminal of second higher sub-block in the series-connected string. In a second example shown in FIG. 3E, a diode-connected transistor having source terminal coupled to one sub-block's $V_{DD}$ terminal is used to generate a potential at the transistor's gate and drain terminals that is higher than the voltage at the $V_{DD}$ terminal and is used to bias the $V_{PBODY}$ terminal of the sub-block. In the examples of FIGS. 3F and 3E, the top sub-block's p-body terminals are connected to $V_{UP\_SUP}$, yielding a zero $V_{BS}$ voltage (i.e., a zero body-source voltage).

As detailed above, sub-blocks of a memory can be coupled in series between the upper and lower power supplies in order to reduce leakage currents in transistors in the sub-blocks. In particular, the leakage currents are reduced in part by reducing the amplitude of the voltage supplied to each sub-block, thereby reducing the voltage amplitude applied across many of the transistors in the sub-blocks. However, transistors within a sub-block that are coupled to other sub-blocks or other circuitry operating with different voltage supply levels, such as bit-line or word-line transistors, may nonetheless be biased with full amplitude voltages even when the sub-block is operating with a reduced supply voltage amplitude. These transistors may therefore be subject to leakage currents.

As a result, in some embodiments, isolation circuitry is used to isolate circuitry within a sub-block from input and/or output terminals of the sub-block. The isolation circuitry can be activated when the integrated circuit is operating in standby mode to isolate a sub-block's circuitry from signals at the input and/or output terminals.

Figure 4:
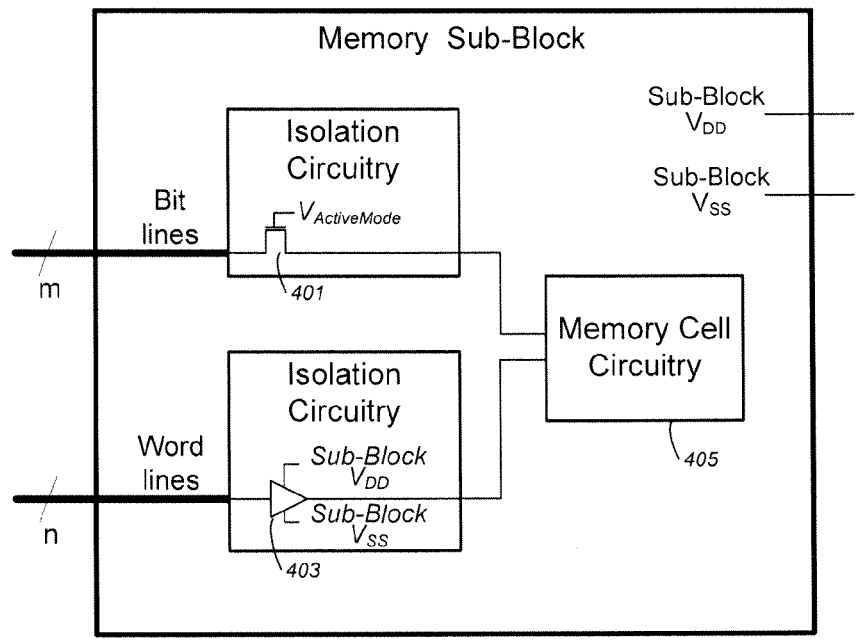
FIG. 4 shows illustrative isolation circuitry for isolating circuitry within a sub-block from input and/or output terminals of the sub-block in standby mode.

In an example, the isolation circuitry isolates bit lines of one memory sub-block from the bit lines of other sub-blocks, and/or from other signals received/transmitted at input/output nodes of the sub-block during standby mode. The isolation circuitry can include one or more switching transistors 401, as shown in FIG. 4. The switching transistor 401 is connected with a body voltage chosen to ensure the body is not forward biased (e.g., an NMOS with a body tied to chip VSS—the substrate voltage). During active mode, the switch is closed by application of a voltage $V_{ActiveMode}$ to the gate. In general, while most transistors forming part of the sub-block circuitry 405 are formed of thin/narrow junction transistors formed using a fine-line CMOS technology, the switching transistors 401 connected to the bit lines may be formed of transistors having thicker oxides and/or broader junctions so as to reduce leakage currents flowing through the transistors. In some embodiments, an I/O transistor is used to provide isolation of bit lines, so that the device is not overstressed when the series stack operates from a supply above the core voltage. An I/O transistor is a transistor having a thicker oxide and/or a broader junction than the minimum size of a fine-line CMOS technology, and which is generally used for circuitry receiving input voltages from or providing output voltages to off-chip circuitry.

In some embodiments, the isolation circuitry includes circuitry to level shift input or output voltage signals to the sub-block. For example, the isolation circuitry may level shift the gate voltage driving the word lines of a sub-block to the voltage of the sub-block so as to avoid overstressing devices and to minimize gate leakage of the word line transistors caused by direct tunneling through the gate oxide. This may be accomplished via an inverter or buffer 403 with an input driven by control signal varying between the $V_{LW\_SUP}$ to $V_{UP\_SUP}$ supply voltages, and the inverter or buffer 403 powered off of the sub-block's local $V_{SS}$ and $V_{DD}$ lines, as shown in FIG. 4. The inverter or buffer 403 may comprise high voltage (I/O) transistors.

In some embodiments, each sub-block may have a different number of SRAM rows or digital logic to better equalize the state retention voltage over each sub-block. In some embodiments, unequal-sizing of sub-blocks is used to compensate for body effect caused by the NMOS and PMOS devices in different sub-blocks having different body bias voltages (e.g., in embodiments in which deep n-wells are not used to provide different sections with different $V_{NBODY}$ potentials.

Figure 5:
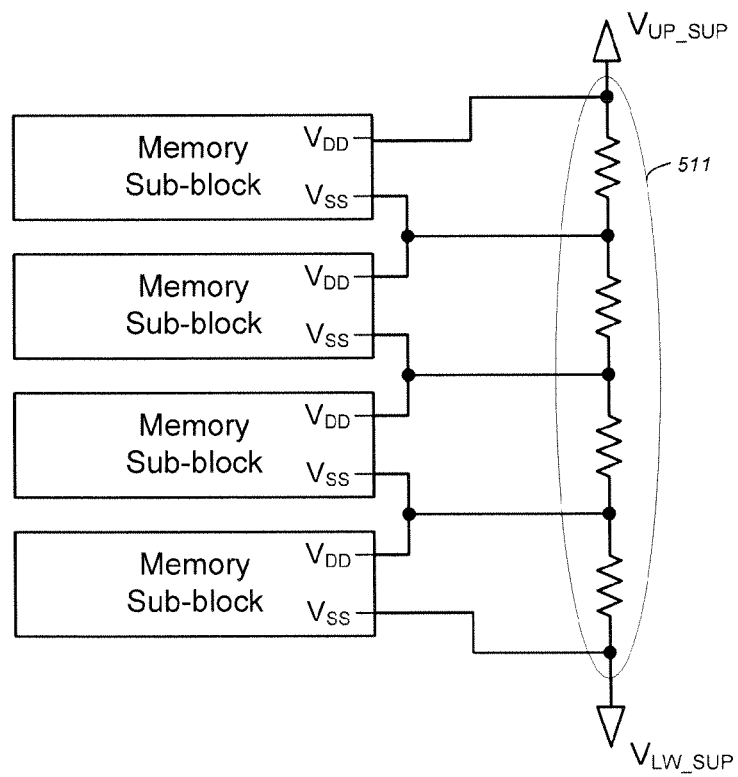
FIG. 5 shows an illustrative resistor divider circuit used for transitioning a set of sub-blocks of integrated circuitry from an active mode configuration to a standby mode configuration.

In some embodiments, a resistor divider circuit 511 (e.g., a resistor string, or other series connection of impedance elements) is used to ease the transition between the active and standby states, as shown in FIG. 5. A resistor divider circuit string 511 generally has a number of taps equal to, or larger than, a number of sub-blocks to be coupled in series in standby mode. The resistor divider circuit is generally used in examples in which one sub-block's $V_{SS}$ terminal is connected to a lower sub-block's $V_{DD}$ terminal in the series coupling (e.g., as shown and described in relation to FIGS. 1C and 2C). Prior to transitioning to standby, the resistor divider circuit 511 is enabled, thereby providing an equal voltage drop across each resistor in the circuit (in examples in which all the resistors have the same resistance). Transition to standby is accomplished by switching the sub-blocks from a parallel connection (e.g., as shown in FIG. 1B) to a series connection (e.g., as shown in FIG. 1C) and connecting the nodes where sub-blocks meet to the appropriate resistor divider circuit node (as shown in FIG. 5). After a short period of time allotted for settling, the resistor divider circuit 511 is disconnected from the nodes between sub-blocks and the resistor divider circuit 511 is disabled or powered down. In some embodiments a switch, transistor, or transmission gate is used to adjust the connectivity of the sub-blocks so as to sequentially supply power to the resistor divider circuit, connect the sub-blocks in series and to the resistor divider string, and once the voltages across the sub-blocks have settled, to disconnect the sub-blocks from the resistor divider string and finally remove power from the resistor divider string.

Figure 6:
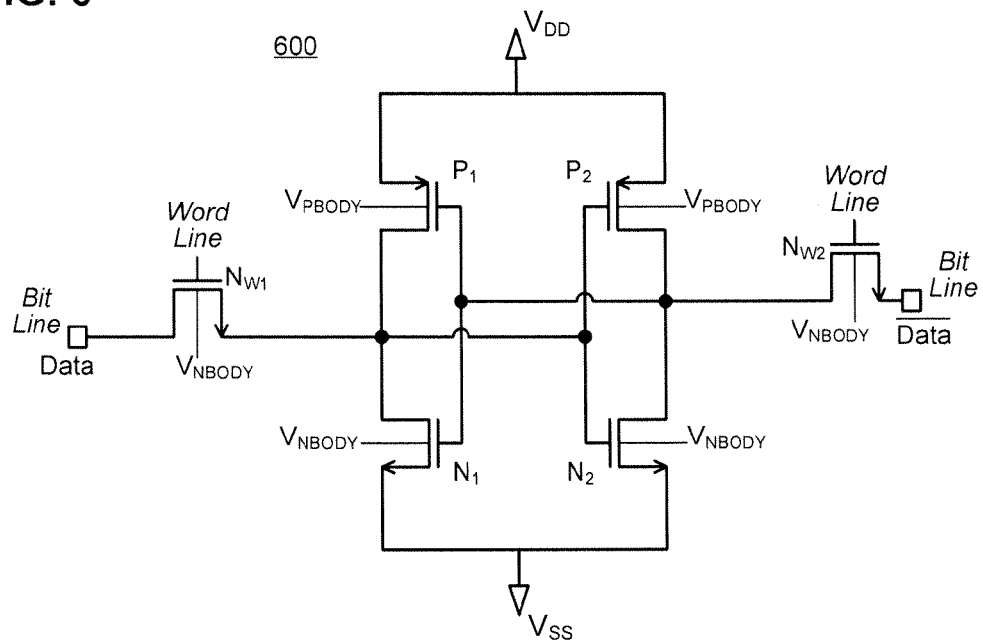
FIG. 6 shows an illustrative SRAM bit cell circuit.

FIG. 6 illustratively shows circuitry 600 contained within one bit cell of a memory or memory sub-block, such as circuitry contained within a bit cell 203 of sub-block 207 of memory 200. Circuitry 600 can include a pair of PMOS transistors $P_1$ and $P_2$ and a pair of NMOS transistors $N_1$ and $N_2$ coupled to form a state retention element. The source terminals of transistors $P_1$ and $P_2$ are coupled to the upper power supply terminal for the bit cell and/or sub-block, while the source terminals of transistors $N_1$ and $N_2$ are coupled to the lower power supply terminal for the bit cell and/or sub-block. Additionally, word line transistors $N_{w1}$ and $N_{w2}$ selectively couple bit lines coupled to nodes Data and $\overline{Data}$ to the state retention element when the respective word lines (respectively coupled to the gate terminals of transistors $N_{w1}$ and $N_{w2}$) are activated. Each of the PMOS transistors $P_1$ and $P_2$ have body terminals coupled to a p-body terminal for the bit cell and/or sub-block, while each of the NMOS transistors $N_1$, $N_2$, $N_W$, and $N_B$ have body terminals coupled to an n-body terminal for the bit cell and/or sub-block.

The integrated circuit 100 of FIG. 1 can be formed, at least in a portion of the integrated circuit, of digital logic laid out with a standard cell library. The layout of the digital logic can be broken up into blocks or sections similar to the SRAM sub-blocks described above. During standby mode, the digital sub-blocks are configured in series (as shown in FIG. 1C); during active mode the digital sub-blocks are arranged in parallel (as shown in FIG. 1B). A difference between SRAM and digital logic stacking is that digital logic may have many connections between standard cells from one sub-block to standard cells in another sub-block, in addition to connections between standard cells within the same sub-block. To ensure reliability of the transistors and minimize gate leakage the signals that cross from an output in one sub-block to an input in another sub-block can be isolated using isolation circuitry such as that described in relation to FIG. 4.

Figure 7:
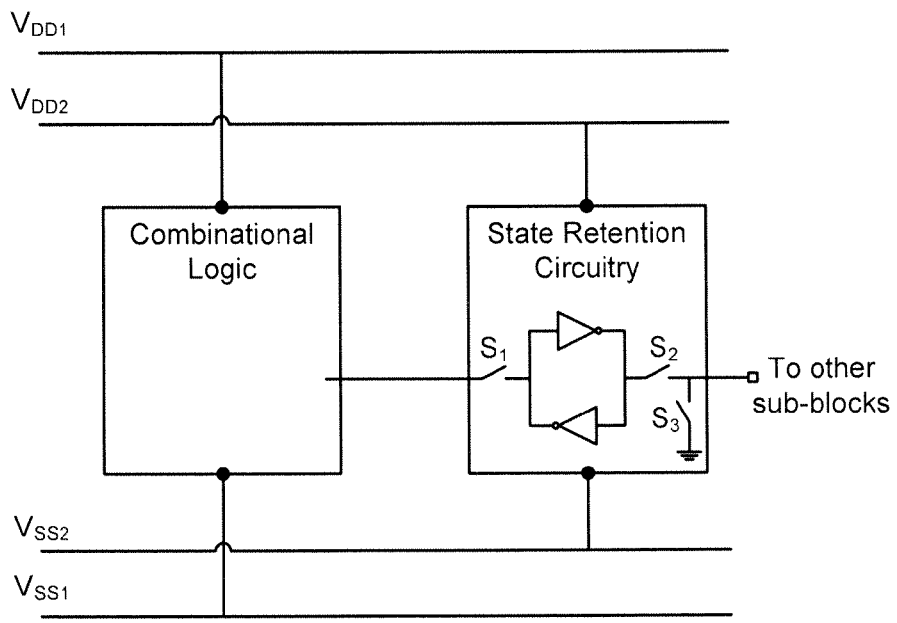
FIG. 7 shows an illustrative circuit configured for providing low leakage currents when operating in standby mode and incorporating isolation circuitry.

In some embodiments, the integrated circuit 100 has two sets supply rails, as shown in FIG. 7. A first set of supply rails ($V_{DD1}$ and $V_{SS1}$) is connected to and provides power to combinational logic and portions of flip-flops and latches that are needed for operation during active mode but are not needed during standby mode. A second set of supply rails ($V_{DD2}$ and $V_{SS2}$) is connected to and provides power to the state-retention elements.

Referring to FIG. 7, during active mode, the $V_{SS1}$ and $V_{SS2}$ supplies are connected to chip ground or chip $V_{LW\_SUP}$, while the $V_{DD1}$ and $V_{DD2}$ supplies are connected to $V_{UP\_SUP}$ or a regulated core voltage for the chip. During sleep mode, the $V_{DD2}$ and $V_{SS2}$ supplies are stacked in series as described above (e.g., as shown in FIG. 1C) to provide a reduced power supply amplitude to the state retention circuitry. Meanwhile, the $V_{DD1}$ and $V_{SS1}$ rails within a sub-block are shorted together and tied to either the sub-block's $V_{DD2}$ or $V_{SS2}$ voltage in order to power down the combinational logic circuitry in the sub-block. Thus, no current will flow through $V_{DD1}$ to $V_{SS1}$ because the potential across these rails is zero. In addition, the voltages of all the combinational outputs within the sub-block are at a level (the sub-block's $V_{DD2}$ or $V_{SS2}$ voltage) that will provide very low gate leakage and will remain within reliability guidelines when they drive, or are driven by, the state-retention elements.

However, when a combinational output or a state-retention output crosses sub-blocks to an input in another sub-block a substantial voltage may occur at the input. The voltage may be positive or negative and can cause increased gate leakage and, if the series-stacked logic is stacked to a voltage higher than the maximum allowed core voltage for the integrated circuit, can cause reliability issues. In some embodiments, sub-block crossings are dealt with by identifying the crossing nets and placing isolation cells or isolation circuitry on the input side of the net, such as the isolation circuitry described above in relation to FIG. 4. The isolation circuitry can include an inverter formed from I/O devices. The isolation circuitry may be powered off of the $V_{DD1}/V_{SS1}$ supplies or the $V_{DD2}/V_{SS2}$ supplies. In other embodiments, crossing nets aren't specifically identified, rather all the standard cells have I/O devices for inputs so all the inputs are tolerant of stacking. In some embodiments there are two flavors of standard cells: one with core input devices and one with I/O input devices. When a crossing occurs then the standard cell is identified and the standard cell is replaced with the I/O-device input flavored version.

Referring to FIG. 7, in some embodiments an integrated circuit maintains the state of flip-flops and latches using a structure similar to a bit cell. The combinational parts of the digital logic (and parts of the flip-flops & latches that are unneeded in standby mode) are coupled to the $V_{DD1}$ and $V_{SS1}$ supplies which are left unpowered during sleep so as to reduce or eliminate the leakage currents associated with these transistors. However, because the output from a digital gate in one sub-block may go into a digital-gate input of another sub-block, isolation circuitry may be needed at the inputs and/or outputs of state retention circuits. In some examples, the total voltage dropped over the string of digital sub-blocks is limited to the maximum allowed core logic voltage in order to avoid over-stressing devices without the use of isolation circuitry between the sub-blocks.

In another example, as shown in FIG. 7, the state-retention portion of a standard cell is isolated from the output by a switch $S_2$ capable of reliably holding off a supply voltage, such as a switch formed of one or more I/O transistors. The input to the state-retention portion is likewise isolated from the powered-down logic by a switch $S_1$ which may include an I/O transistor. The output of the standard cell is pulled to ground or the chip lower supply voltage $V_{LW\_SUP}$ by switch $S_3$. Since the output of the standard cell goes into other sub-blocks' combinational logic having their respective $V_{DD1}$ and $V_{SS1}$ terminals pulled to ground during standby mode, reliability issues are avoided and the chip's full supply amplitude value can be applied to the string of digital sub-blocks.

Direct current (DC) to DC converters (DCDC converters) are used to provide a DC voltage of one voltage level, based on power received from a DC voltage source of another voltage level. DCDC converters can be used to provide a reduced voltage supply level in circuitry operating in standby mode. However, DCDC converters have an efficiency that is generally substantially less than 100%. The loss in efficiency is due to the power needed to drive switches and monitor supply and/or output, as well as loss associated with the physical conversion between higher and lower voltages, whether it is an inductive- or capacitive-based DCDC converter. On the other hand, configuring digital circuits as described above and shown in FIGS. 1-7 provides for near 100% efficient utilization of the power from the supply.

Nevertheless, in some embodiments an on-chip DCDC converter is used to reduce supply-current consumed during standby mode instead of or in conjunction with switching the configuration of SRAM rows or sub-blocks of a digital circuit between a first and a second configuration. In this embodiment, a switched-capacitor step-down converter operates by charging a plurality of capacitors directly from the supply and then taking this charge and presenting it to the digital circuit at a lower voltage by reconfiguring the capacitor configuration using switches. Because the digital-leakage currents are generally small compared to the active-mode currents, the DCDC converter may be made comparably small. During active mode, the DCDC converter is disabled and power is supplied directly to the circuitry (e.g., SRAM circuits) from the integrated circuit's power supply circuitry. During the transition to standby mode, the DCDC converter is enabled and provides the current needed to maintain state in the circuitry (e.g., SRAM circuits). By integrating the DCDC converter on the same chip as the digital circuit, tight coupling is enabled between the state of the digital circuit (active/standby) and the DCDC converter. The difference between active- and standby-currents may be substantial. Integrating on chip the standby-mode DCDC converter allows for improved efficiency of the DCDC converter, as the converter doesn't need to operate efficiently over a large dynamic range (i.e., the DCDC converter need only operate efficiently over a small range of supplied current amplitude).

Modern semiconductor devices are usually built in a process having two or more implanted wells formed in a lightly-doped substrate. For a common 65 nm integrated circuit (IC) process, twin wells are formed on a p-substrate; NMOS devices are built in a p-well and PMOS devices are built in an n-well. Because the n-well is junction isolated from the n-well, the $V_{DD}$ of the sub-blocks may be set independently without any issue. However, the p-well is normally formed in a p-substrate; thus, the NMOS devices have a common back gate voltage with all the other devices built in the p-substrate. However, the addition of a deep N-well (DNW) implant beneath the p-well may be used to isolate the NMOS back gate from the p-substrate. In a conventional structure, one or more NMOS devices are built in a p-well laterally isolated from the substrate by an N-well implant and vertically isolated from the substrate by the so-called deep N-well. This structure allows the NMOS body terminal to be connected to a voltage that is distinct from the p-substrate voltage. Note that the deep N-well is generally formed by ion implantation of a dopant species a substantial distance beneath the surface using energies of >1 MeV (i.e., greater than 1 MeV). The implantation of the deep N-well is usually performed at an angle. Thus, the deep n-well can spread laterally a substantial distance from the desired isolation region resulting in a large lateral spacing requirement in the process' geometric design rules from the DNW edge to any N-wells that are not part of the isolation structure. Such a large spacing (generally several microns) makes isolation of the NMOS devices in a digital circuit using deep N-well unpractical with conventional structures.

Figure 8:
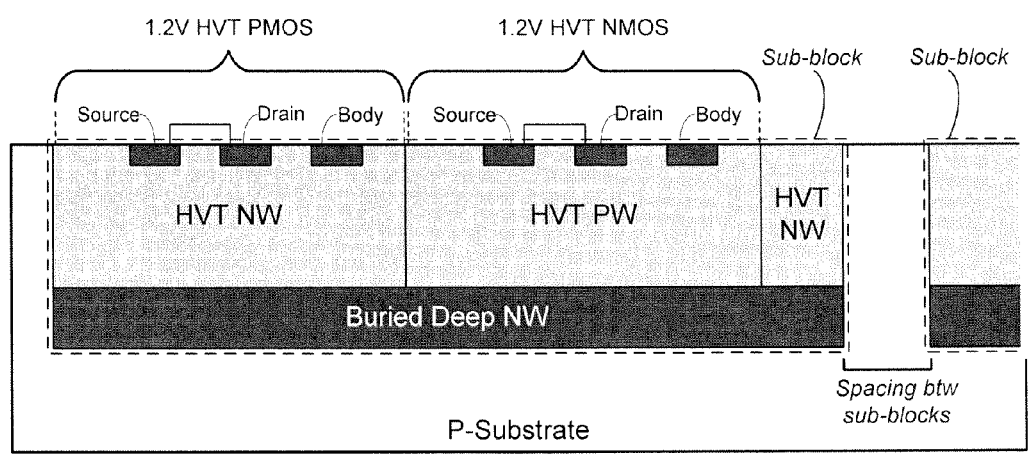
FIG. 8 shows an illustrative integrated circuit structure having NMOS and PMOS devices formed therein that are isolated from a semiconductor substrate.

FIG. 8 shows an illustrative CMOS integrated circuit structure having NMOS and PMOS devices that are isolated from the semiconductor substrate. The NMOS and PMOS devices are high-$V_T$ (HVT) devices having elevated threshold voltages that are formed in a 1.2V process. Each PMOS device is formed in an n-well, and each NMOS device is formed in a p-well, where both the n- and p-wells of a sub-block are formed over a buried deep n-well for the sub-block. The buried deep n-well serves as an isolation structure and is used to electrically isolate the n- and p-wells from the substrate and a substrate voltage. The buried deep n-well can be electrically connected to the n-well. In general, separate deep n-wells are provided for each sub-block of integrated circuit circuitry, and the deep n-well can extend underneath all transistors within a sub-block having body terminals that are to be electrically isolated from the substrate voltage.

Referring to FIG. 8, if a deep N-well is formed under an entire sub-block of an SRAM or digital circuit then: 1) the NMOS devices will be isolated from the substrate and the body and sources may be tied to a voltage distinct from ground; and 2) the PMOS devices may be formed in an N-Well, the PMOS body voltage being electrically connected to the deep N-well. Note that this structure, shown in FIG. 8, provides independent body terminals for both NMOS and PMOS without increasing the area of a sub-block. Since different sub-blocks may have different PMOS body potentials, the region between sub-blocks may include a spacing region of a distance specified under the process geometric design rules. Note that since the number of sub-blocks is generally small, the increase in die area from spacing between the deep N-well structures is small.

Referring to FIG. 8, the N-well is generally biased with a voltage greater than or equal to the substrate voltage as the N-well is tied to the PMOS body. The isolated p-well is reverse-biased with respect to the n-well and the deep n-well, since the NMOS body is at a lower potential than the PMOS body. Thus, the junctions are reverse biased and junction-isolated from the substrate. Note also that the n-well to substrate junction and the deep n-well to substrate junction are the only junctions over which a large voltage will appear. For example, the top sub-block of FIG. 3A would have the full value of $V_{UP\_SUP}-V_{LW\_SUP}$ across the n-well to p-substrate junction. Because the wells are generally lightly doped and the dimensions large in comparison with the small dimensions associated with the transistors, the sub-blocks may have a substantial absolute voltage with respect to the substrate without concerns about device breakdown or reliability.

In some embodiments an SOI (silicon on insulator) layer (either SIMOX or bonded wafer) is used to provide isolation between the NMOS p-wells.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A method for reducing leakage current in an integrated circuit comprising a plurality of sub-blocks of circuitry each including an upper power-supply terminal, a lower power-supply terminal, and an input or output signal terminal, the method comprising steps of:
   coupling the upper and lower power-supply terminals of the sub-blocks of the plurality of sub-blocks to couple the sub-blocks in parallel between upper and lower active-mode power supplies when the integrated circuit is operating in an active mode;
   coupling the upper and lower power-supply terminals of two or more sub-blocks of the plurality of sub-blocks to couple the two or more sub-blocks in series between upper and lower standby-mode power supplies when the integrated circuit is operating in a standby mode; and
   activating isolation circuitry within one of the two or more sub-blocks to isolate circuitry of the one sub-block from the input or output signal terminal of the one sub-block when the integrated circuit is operating in the standby mode.

2. The method of claim 1,
   wherein the coupling of the sub-blocks in parallel comprises coupling, for each sub-block, the upper power-supply terminal of the sub-block to the upper active-mode power supply and the lower power-supply terminal of the sub-block to the lower active-mode power supply, and
   wherein the coupling of the sub-blocks in series comprises coupling, for a first sub-block in the series coupling, the lower power-supply terminal of the first sub-block to the lower standby-mode power supply and the upper power-supply terminal of the first sub-block to the lower power-supply terminal of a next sub-block in the series, and coupling, for a last sub-block in the series coupling, the lower power-supply terminal of the last sub-block to the upper power-supply terminal of a previous sub-block in the series and the upper power-supply terminal of the last sub-block to the upper standby-mode power supply.

3. The method of claim 1, wherein each of the two or more sub-blocks comprises at least one state retention element, the method further comprising:
coupling the upper and lower power-supply terminals of a sub-block of the plurality of sub-blocks not comprising a state retention element to the lower standby-mode power supply when the integrated circuit is operating in the standby mode.

4. The method of claim 1, wherein the upper and lower active-mode power supplies provide different voltages than the upper and lower standby-mode power supplies.

5. The method of claim 1, further comprising:
selecting a number of sub-blocks to couple in series between the upper and lower standby-mode power supplies in the series coupling of two or more sub-blocks, based on a standby-mode power-supply amplitude and a minimum supply amplitude needed by each sub-block in the series coupling.

6. The method of claim 5, further comprising:
monitoring the standby-mode power supply amplitude in order to dynamically adjust the number of sub-blocks to couple in series between the upper and lower standby-mode power supplies based on the standby mode power-supply amplitude.

7. The method of claim 1, further comprising:
for at least one sub-block of the two or more sub-blocks coupled in series, coupling a body terminal of the one sub-block to a voltage different than a voltage at a source terminal of a transistor of the one sub-block having a body terminal connected to the body terminal of the one sub-block, when the integrated circuit is operating in the standby mode,
wherein the body terminal of each sub-block is coupled to a body terminal of at least one transistor in the sub-block.

8. The method of claim 7, wherein for each of the two or more sub-blocks, the body terminal of the sub-block is coupled to one of the upper or lower power-supply terminal of the sub-block, when the integrated circuit is operating in the standby mode.

9. The method of claim 8, further comprising:
coupling, for each of the two or more sub-blocks, a second body terminal of the sub-block to the other of the upper or lower power-supply terminal of the sub-block, when the integrated circuit is operating in the standby mode,
wherein the second body terminal of each sub-block is coupled to a body terminal of at least one transistor in the sub-block.

10. The method of claim 7, wherein for each of the two or more sub-blocks, the body terminal of the sub-block is coupled to a node having a voltage that is higher than a voltage of the upper power-supply terminal of the sub-block or that is lower than a voltage of the lower power-supply terminal of the sub-block.

11. The method of claim 1, wherein each sub-block has an associated deep n-well region formed in a substrate of the integrated circuit, and the circuitry of each sub-block is formed over the deep n-well region associated with the sub-block.

12. The method of claim 1, wherein each sub-block is isolated from other sub-blocks of the plurality of sub-blocks using one or more of a deep n-well implant, a deep p-well implant, or a silicon dioxide layer under the sub-block.

13. The method of claim 1, further comprising:
upon determining that the integrated circuit is to be switched to the standby mode, activating a resistor divider circuit coupled between the upper and lower standby-mode power supplies,
wherein the resistor divider circuit comprises a plurality of nodes providing bias voltages of increasing value between the lower and upper standby-mode power supplies, and
wherein the coupling of the two or more sub-blocks comprises coupling nodes common to pairs of sub-blocks in the coupling of the two or more sub-blocks in series to nodes of the plurality of nodes of the resistor divider circuit providing bias voltages of increasing value.

14. The method of claim 13, further comprising:
disconnecting the coupling nodes from the resistor divider circuit after the nodes have reached a state of equilibrium.

15. An integrated circuit comprising:
a plurality of sub-blocks of circuitry each comprising a portion of the integrated circuit and each including an upper power-supply terminal, a lower power-supply terminal, and an input or output signal terminal; and
power supply selection circuitry operative to selectively couple, for each sub-block of the plurality of sub-blocks, the upper and lower power-supply terminals of the sub-block to power supplies of the integrated circuit,
wherein the power supply selection circuitry is operative to:
couple the upper and lower power-supply terminals of the sub-blocks of the plurality of sub-blocks to couple the sub-blocks in parallel between upper and lower active-mode power supplies when the integrated circuit is operating in an active mode;
couple the upper and lower power-supply terminals of two or more sub-blocks of the plurality of sub-blocks to couple the two or more sub-blocks in series between upper and lower standby-mode power supplies when the integrated circuit is operating in a standby mode; and
activate isolation circuitry within one of the two or more sub-blocks to isolate circuitry of the one sub-block from the input or output signal terminal of the one sub-block when the integrated circuit is operating in the standby mode.

16. The integrated circuit of claim 15, wherein the power supply selection circuitry is operative to:
couple the sub-blocks in parallel by coupling, for each sub-block, the upper power-supply terminal of the sub-block to the upper active-mode power supply and the lower power-supply terminal of the sub-block to the lower active-mode power supply, and
couple the sub-blocks in series by coupling, for a first sub-block in the series coupling, the lower power-supply terminal of the first sub-block to the lower standby-mode power supply and the upper power-supply terminal of the first sub-block to the lower power-supply terminal of a next sub-block in the series, and coupling, for a last sub-block in the series coupling, the lower power-supply terminal of the last sub-block to the upper power-supply terminal of a previous sub-block in the series and the upper power-supply terminal of the last sub-block to the upper standby-mode power supply.

17. The integrated circuit of claim 15, wherein:
- each of the two or more sub-blocks comprises at least one state retention element, and
- the power supply selection circuitry is further operative to couple the upper and lower power-supply terminals of a sub-block of the plurality of sub-blocks not comprising a state retention element to the lower standby-mode power supply when the integrated circuit is operating in the standby mode.

18. The integrated circuit of claim 15, wherein a voltage between the upper and lower active-mode power supply terminals is different than a voltage between the upper and lower standby-mode power supply terminals.

19. The integrated circuit of claim 15, wherein the power supply selection circuitry is further operative to:
- select a number of sub-blocks to couple in series between the upper and lower standby-mode power supplies in the series coupling of two or more sub-blocks, based on a standby-mode power-supply amplitude and a minimum supply amplitude needed by each sub-block in the series coupling.

20. The integrated circuit of claim 19, wherein the power supply selection circuitry is further operative to:
- monitor the standby-mode power supply amplitude in order to dynamically adjust the number of sub-blocks to couple in series between the upper and lower standby-mode power supplies based on the standby mode power-supply amplitude.

21. The integrated circuit of claim 15, wherein the power supply selection circuitry is further operative to:
- for at least one sub-block of the two or more sub-blocks coupled in series, coupling a body terminal of the one sub-block to a voltage different than a voltage at a source terminal of a transistor of the one sub-block having a body terminal connected to the body terminal of the one sub-block, when the integrated circuit is operating in the standby mode,
- wherein the body terminal is coupled to a body terminal of at least one transistor in the sub-block.

22. The integrated circuit of claim 21, wherein for each of the two or more sub-blocks, the body terminal of the sub-block is coupled to one of the upper or lower power-supply terminal of the sub-block, when the integrated circuit is operating in the standby mode.

23. The integrated circuit of claim 22, wherein the power supply selection circuitry is further operative to:
- couple, for each of the two or more sub-blocks, a second body terminal of the sub-block to the other of the upper or lower power-supply terminal of the sub-block, when the integrated circuit is operating in the standby mode,
- wherein the second body terminal of each sub-block is coupled to a body terminal of at least one transistor in the sub-block.

24. The integrated circuit of claim 21, wherein for each of the two or more sub-blocks, the body terminal of the sub-block is coupled to a node having a voltage that is higher than a voltage of the upper power-supply terminal of the sub-block or that is lower than a voltage of the lower power-supply terminal of the sub-block.

25. The integrated circuit of claim 15, wherein each sub-block has an associated isolation structure formed in a substrate of the integrated circuit, and the circuitry of each sub-block is formed over the isolation structure associated with the sub-block.

26. The integrated circuit of claim 25, wherein the isolation structure includes one of a deep n-well implant, a deep p-well implant, or a silicon dioxide layer in a silicon on insulator structure.

27. The integrated circuit of claim 15, further comprising:
- a resistor divider circuit comprising a plurality of nodes for providing bias voltages of increasing value between the lower and upper standby-mode power supplies,
- wherein the power supply selection circuitry is further operative to:
  - upon determining that the integrated circuit is to be switched to the standby mode, activate the resistor divider circuit coupled between the upper and lower standby-mode power supplies, and
- wherein the coupling of the two or more sub-blocks comprises coupling nodes common to pairs of sub-blocks in the coupling of the two or more sub-blocks in series to nodes of the plurality of nodes of the resistor divider circuit providing bias voltages of increasing value.

\* \* \* \* \*